(12) United States Patent
West et al.

(10) Patent No.: US 6,598,998 B2
(45) Date of Patent: Jul. 29, 2003

(54) SIDE EMITTING LIGHT EMITTING DEVICE

(75) Inventors: Robert S. West, Clarkston, MI (US); Gary D. Sasser, San Jose, CA (US); James W. Stewart, San Jose, CA (US)

(73) Assignee: Lumileds Lighting, U.S., LLC, San Jose, CA (US)

( * ) Notice: Subject to any disclaimer, the term of this patent is extended or adjusted under 35 U.S.C. 154(b) by 69 days.

(21) Appl. No.: 09/849,042

(22) Filed: May 4, 2001

(65) Prior Publication Data

US 2002/0163810 A1 Nov. 7, 2002

(51) Int. Cl.[7] .................................................. F21V 7/00
(52) U.S. Cl. ........................ 362/307; 362/308; 362/310
(58) Field of Search ................................. 362/307, 308, 362/309, 326, 327, 328, 329, 31, 800, 556, 555, 582; 313/500, 512

(56) References Cited

U.S. PATENT DOCUMENTS

| | | | | |
|---|---|---|---|---|
| 4,192,994 A | | 3/1980 | Kastner ....................... 250/280 |
| 4,342,908 A | * | 8/1982 | Henningsen et al. ... 250/227.11 |
| 4,698,730 A | | 10/1987 | Sakai et al. .................. 362/311 |
| 5,140,220 A | | 8/1992 | Hasegawa ................... 313/512 |
| 5,302,778 A | * | 4/1994 | Maurinus .................... 174/52.4 |
| 5,335,157 A | | 8/1994 | Lyons ......................... 362/297 |
| 5,404,282 A | | 4/1995 | Klinke et al. ................ 362/249 |
| 5,452,190 A | | 9/1995 | Priesemuth .................. 362/255 |
| 5,608,290 A | | 3/1997 | Hutchisson et al. ........ 315/200 |
| 5,777,433 A | | 7/1998 | Lester et al. ................ 313/512 |
| 5,806,955 A | | 9/1998 | Parkyn, Jr. et al. ......... 362/31 |
| 5,894,195 A | | 4/1999 | McDermott ................. 313/512 |
| 5,894,196 A | | 4/1999 | McDermott ................. 313/512 |
| 5,897,201 A | * | 4/1999 | Simon ......................... 362/268 |
| 5,898,267 A | | 4/1999 | McDermott ................. 313/512 |
| 6,030,099 A | | 2/2000 | McDermott ................. 362/276 |
| 6,044,196 A | | 3/2000 | Winston et al. ............. 385/146 |
| 6,048,083 A | | 4/2000 | McDermott ................. 362/337 |
| 6,177,761 B1 | | 1/2001 | Pelka et al. ................. 313/512 |
| 6,450,661 B1 | * | 9/2002 | Okumura .................... 362/240 |

FOREIGN PATENT DOCUMENTS

| | | |
|---|---|---|
| EP | 0450560 A2 | 10/1991 |
| WO | WO 98/26212 | 6/1998 |
| WO | WO 99/13266 | 3/1999 |
| WO | WO 01/07828 A1 | 2/2001 |

OTHER PUBLICATIONS

Parkyn et al., The Black Hole™: Cuspated waveguide–injectors and illuminators for LEDs; Part of the SPIE Conference on Nonimaging Optics: Maximum Efficiency Light Transfer V, Denver, CO, Jul. 1999.

Hyper ARGUS® LED, Hyper–Bright, 3mm (T1) LED, Non Diffused; Mar. 1, 2000; Infineon Technologies, pp. 1–9.

"Backlighting LED 3mm", Telefunken Electronic Creative Technologies, Edition A, 10/90, pp. 1–4.

* cited by examiner

*Primary Examiner*—Sandra O'Shea
*Assistant Examiner*—Ali Alavi
(74) *Attorney, Agent, or Firm*—Patent Law Group LLP; Rachel V. Leiterman

(57) ABSTRACT

A lens mounted to a light emitting diode package internally redirects light within the lens so that a majority of light is emitted from the lens approximately perpendicular to a package axis of the light emitting diode package. In one embodiment, the light emitted by the light emitting diode package is refracted by a sawtooth portion of the lens and reflected by a total internal reflection portion of the lens.

63 Claims, 14 Drawing Sheets

SIDE EMITTING LIGHT EMITTING DEVICE

RELATED APPLICATION

This invention is related to U.S. Ser. No. 09/849,084, M-11591 US) filed May 4, 2001, entitled LED LENS.

BACKGROUND OF THE INVENTION

1. Field of the Invention

This invention relates generally to light emitting devices and more particularly to side emitting light emitting diodes (LEDs).

2. Description of Related Art

FIG. 1A illustrates a conventional LED package 10. LED package 10 has a hemispherical lens 12 of a type well-known in the art. Package 10 may also have a reflector cup (not shown), in which an LED chip (not shown) resides, that reflects light emitted from the bottom and sides of the LED chip toward the observer. In other packages, other types of reflectors reflect the LED chip's emitted light in a particular direction.

Lens 12 creates a field of illumination 14 roughly along a longitudinal package axis 16 of LED package 10. The vast majority of light emitted from an LED package 10 with a hemispherical lens 12 is emitted upwards away from LED package 10 with only a small portion emitted out from the sides of LED package 10.

FIG. 1B illustrates a known light emitting diode (LED) package 30 with a longitudinal package axis 26. LED package 30 includes an LED chip 38, a lens 32 with straight vertical sidewall 35 and a funnel-shaped top surface 37. There are two main paths in which the light will travel through package 30. The first light path P1 is desirable with the light emitted from chip 38 and traveling to surface 37 where total internal reflection (TIR) causes the light to exit through sidewall 35 at approximately 90 degrees to the longitudinal axis. The second light path P2 is light emitted from chip 38 towards sidewall 35 at an angle causing TIR or a reflection from sidewall 35 causing the light to exit package 30 at an angle not close to perpendicular to the longitudinal axis. This path is not desirable and limits the efficiency of side extracted light.

FIG. 2 illustrates the conventional LED package 10 of FIG. 1 coupled along an edge of a portion of a refractive light guide 20. LED package 10 is positioned on the edge of light guide 20 along the width of light guide 20. Light rays R1, R2, R3 emitted by LED package 10 are propagated along the length of light guide 20. FIG. 3 illustrates a plurality of conventional LED packages 10 positioned along the width of light guide 20 of FIG. 2. These conventional LED/light guide combinations are inefficient as they require a large number of LED packages 10 to illuminate the light guide and result in coupling inefficiencies due to relatively small acceptance angles. These conventional LED packages 10 must be arranged along the entire length of one side of light guide 20 to fully illuminate light guide 20.

A need exists for an LED package to couple efficiently to shallow reflectors and thin light guides. A need also exists for an LED package to allow these secondary optical elements to have relatively large illuminated areas.

SUMMARY OF THE INVENTION

Light emitting devices with side emission of light allow light guides and reflectors to have very thin profiles with large illuminated areas.

In accordance with one embodiment of the invention, a light emitting device includes a light emitting diode package. The package has a front surface and a back surface and contains a light emitting diode for emitting light at least in a first direction approximately normal to the front surface away from the package. There is also a lens extending from the front surface of the package for receiving light from the diode. The lens is shaped to redirect light received from the diode, including the light in the first direction, such that a majority of light emitted from the lens is generally parallel to the front surface of the package.

In accordance with another embodiment of the invention, a method of emitting light from a light emitting diode includes generating a light output from a light emitting diode package. The package has a front surface and a back surface and contains a light emitting diode for emitting light at least in a first direction approximately normal to the front surface away from the package. The method also includes redirecting light from the light emitting diode using a lens extending from the front surface of the package for receiving light from the diode, including the light in the first direction where the lens redirects light such that a majority of light emitted from the lens is generally parallel to the front surface of the package.

This invention will be more fully understood in light of the following detailed description taken together with the accompanying drawings.

BRIEF DESCRIPTION OF THE DRAWINGS

Use of the same reference symbols in different figures indicates similar or identical items.

DETAILED DESCRIPTION OF THE PREFERRED EMBODIMENTS

Figure 1A:
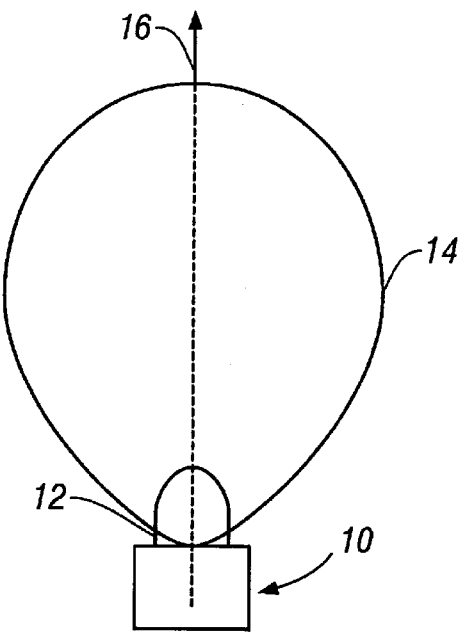
FIG. 1A illustrates a conventional LED package.
Figure 1B:
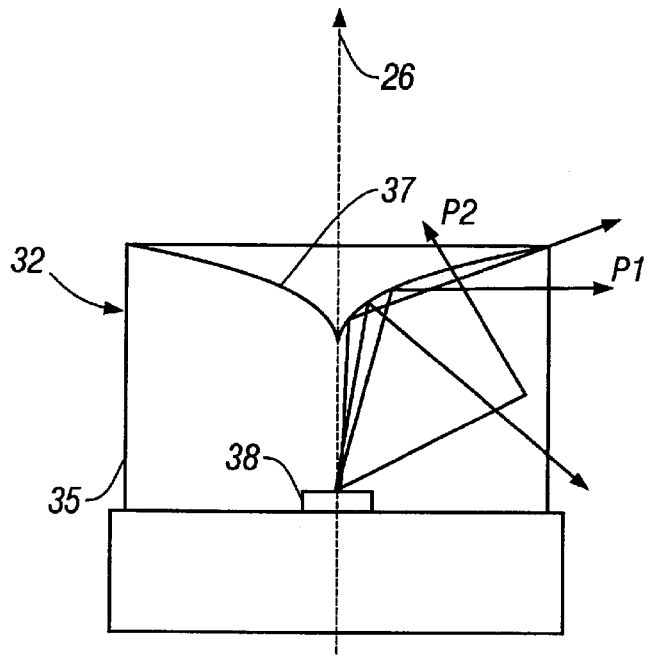
FIG. 1B illustrates another conventional LED package.
Figure 2:
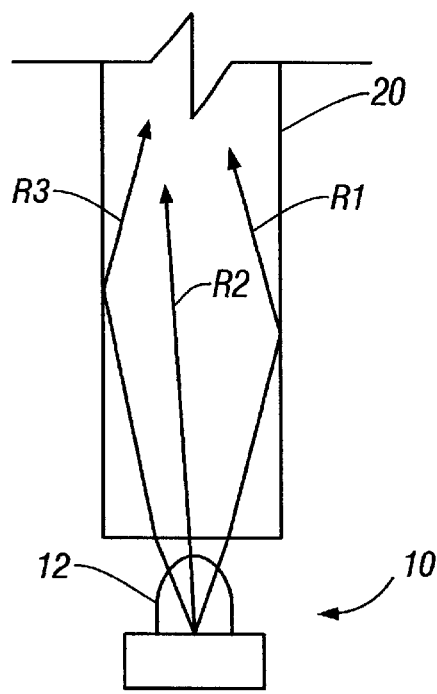
FIG. 2 illustrates a cross-sectional view of a conventional edge-illuminated light guide.
Figure 3:
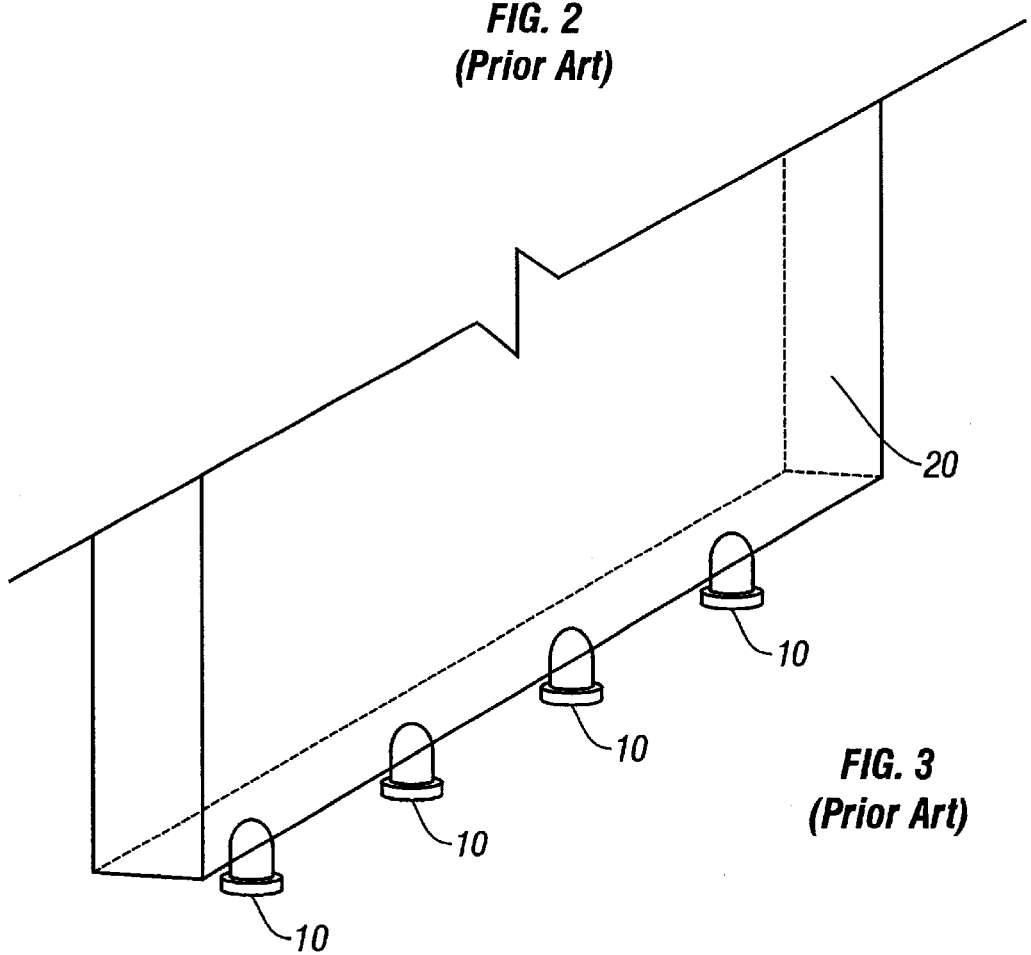
FIG. 3 illustrates a perspective view of the light guide of FIG. 2.
Figure 4:
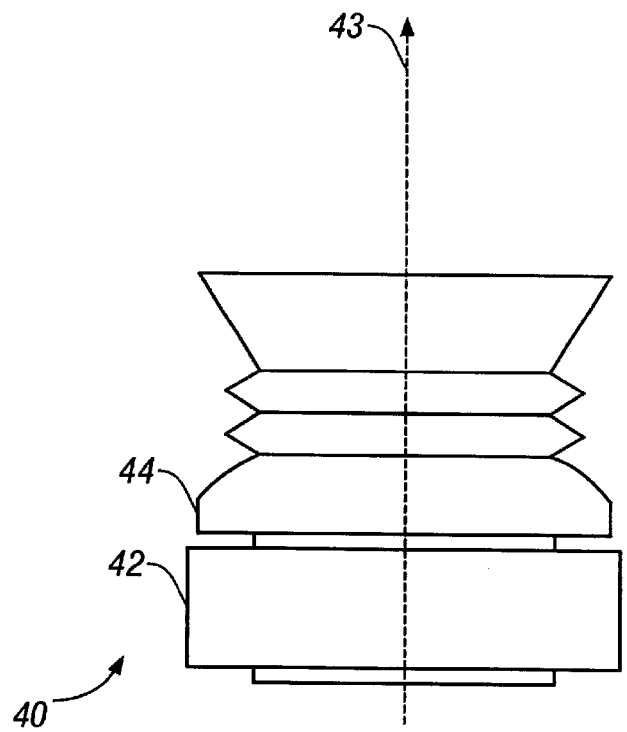
FIG. 4 illustrates one embodiment of the invention.
Figure 5A:
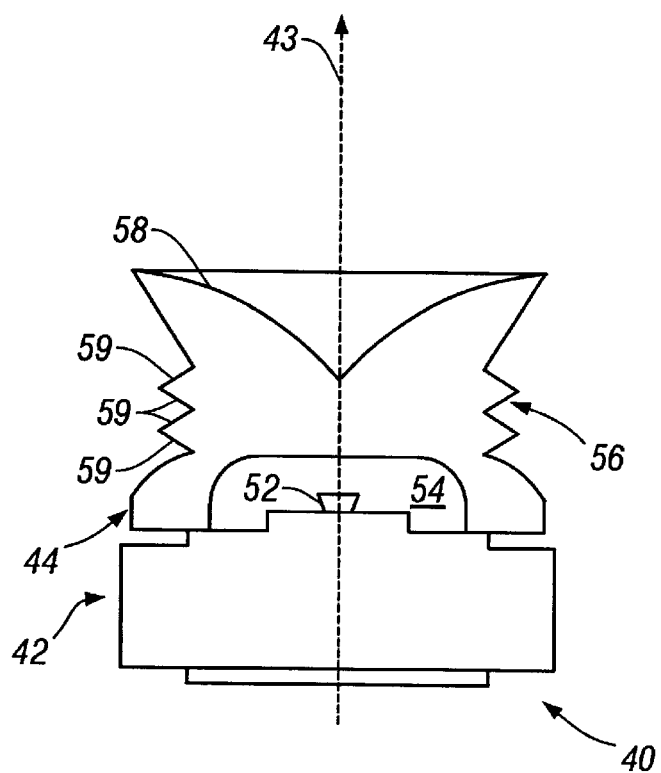
FIG. 5A illustrates a cross-sectional view of the LED package of FIG. 4.

FIG. 4 illustrates an example of a side emitting LED package 40 in accordance with one embodiment of the invention. LED package 40 includes a longitudinal package axis 43, an LED package base 42 and a lens 44. Lens 44 is coupled to LED package base 42. Longitudinal package axis 43 passes through the center of LED package base 43 and lens 44. As seen in FIG. 5A, a surface of LED package base 42 supports an LED chip 52 (a semiconductor chip having a light emitting pn junction) for generating light. LED chip 52 may be one of any number of shapes, including but not limited to a truncated inverted pyramid (TIP) (shown), cube, rectangular solid, or hemisphere. LED chip 52 includes a bottom surface that may be in contact with, or coated with, a reflective material. Although LED chip 52 may emit light from all of its sides, base 42 is generally configured to reflect emitted light upwards towards lens 44 along the longitudinal axis of the package. Such bases are conventional and may include a parabolic reflector in which LED chip 52 resides on a surface of package base 42. One such package is shown in U.S. Pat. No. 4,920,404, assigned to the present assignee and incorporated herein by reference.

Lens 44 may be manufactured as a separate component using a number of well-known techniques such as diamond turning (i.e., the lens is shaped by a lathe with a diamond-bit), injection molding, and casting. Lens 44 is made of a transparent material, including but not limited to cyclic olefin copolymer (COC), polymethylmethacrolate (PMMA), polycarbonate (PC), PC/PMMA, and polyetherimide (PEI). Lens 44 includes an index of refraction (n) ranging from between 1.45 to 1.6, preferably 1.53, but could have an index of refraction higher or lower based on the material used. In the alternative, lens 44 may be formed onto LED package base 42 and LED chip 52 by various techniques including but not limited to injection molding (e.g., insert molding), and casting.

There is a volume 54 between lens 44 and LED chip 52. Volume 54 may be filled and sealed to prevent contamination of LED 52 using silicone. Volume 54 may also be in a vacuum state, contain air or some other gas, or filled with an optically transparent resin material, including but not limited to resin, silicone, epoxy, water or any material with an index of refraction in the range of 1.4 to 1.6 may be injected to fill volume 54. The material inside volume 54 may be colored to act as a filter in order to allow transmission of all or only a portion of the visible light spectrum. If silicone is used, the silicone may be hard or soft. Lens 44 may also be colored to act as a filter.

Lens 44 includes a sawtooth, refractive portion 56 and a total internal reflection (TIR) funnel portion 58. The sawtooth portion 56 is designed to refract and bend light so that the light exits from lens 44 as close to 90 degrees to the longitudinal package axis 43 as possible. The sawteeth or refractive surfaces 59 of the sawtooth portion 56 are all light transmissive. Any number of sawteeth 59 may be used within a sawtooth portion of a given length; preferably there is at least one sawtooth. Lens 44 may be formed as a single piece or, in the alternative, as separate components coupled together.

Funnel portion 58 is designed as a TIR surface. The TIR surface reflects light such that light exits from lens 44 as close to 90 degrees to a longitudinal package axis 43 of LED package 40 as possible. Approximately 33% of the light emitted from LED chip 52 is reflected off the TIR surface of funnel-shaped portion 58 of lens 44. A metallization layer (e.g., aluminum) may be placed on top of funnel portion 58 to prevent light transmission through the TIR surface. A coating or film (e.g., a U.V. inhibitor) may be placed on top of the funnel portion 58 to prevent degradation of the lens as PC degrades in the presence of U.V. light.

The interface between lens 44 and LED package base 42 may also be sealed using any well-known sealant, such as Room Temperature Vulcanizing (RTV) or the like.

Figure 5B:
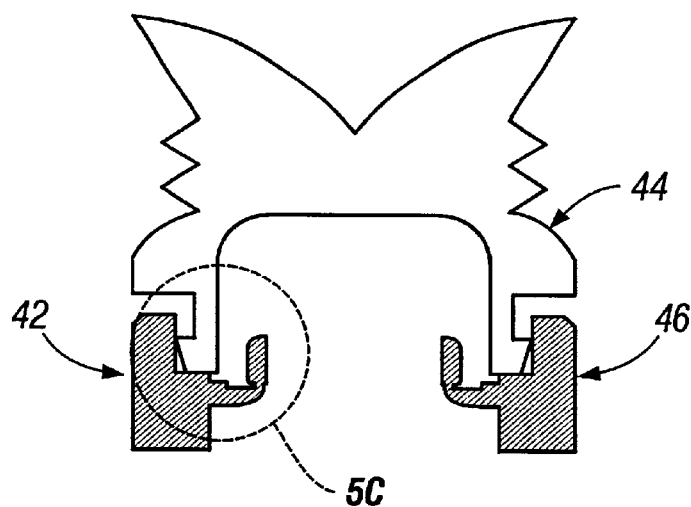
FIG. 5B illustrates a cross-sectional view of the lens mating to the housing of the LED package base.
Figure 5C:
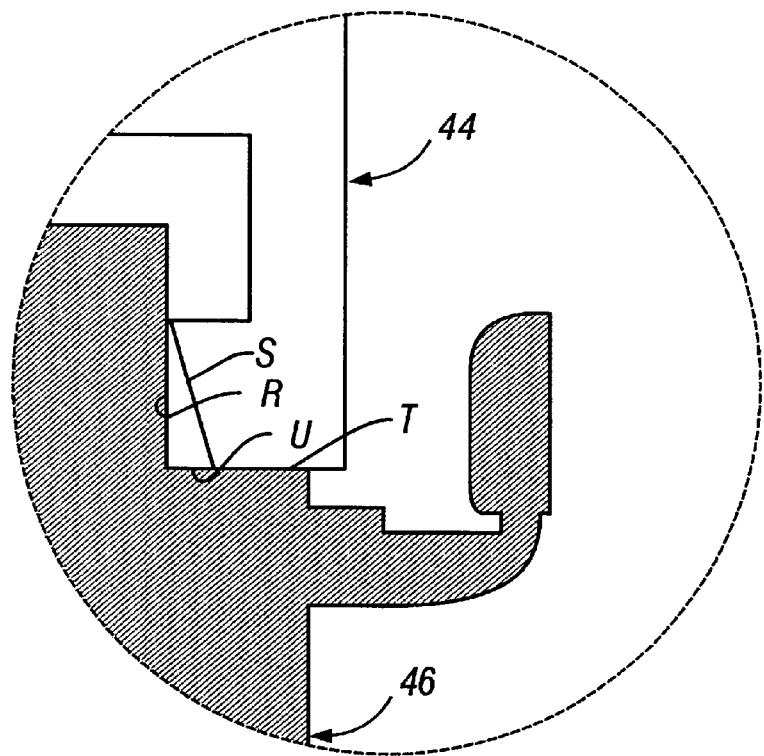
FIG. 5C illustrates a close-up of the lens/housing mating of FIG. 5B.

FIG. 5B illustrates a cross-sectional view of alternative mating of lens 44 to housing 46 of LED package base 42. For clarity, LED chip 52 and other features of base 42 are not shown. Lens 44 may also be attached to LED package base 42 by various attachment methods, including but not limited to snap-fitting, friction-fitting, heat staking, adhesive bonding, and ultra-sonic welding. The features of lens 44, as shown in FIG. 5B, are applicable to lenses that are either formed as a separate component or encapsulated onto LED package base 42. FIG. 5C illustrates a close-up of the lens/housing mating of FIG. 5B. Surface S may snap fit into surface R. Surface S may friction fit tight with surface R. Surface T may be welded to surface U using various methods including, without limitation, plastic welding, sonic welding, and linear welding. Sealing or bonding involves several possible combinations, such as surface S and/or T of lens 44 being sealed/bonded to surface R and/or U of housing 46.

Figure 5D:
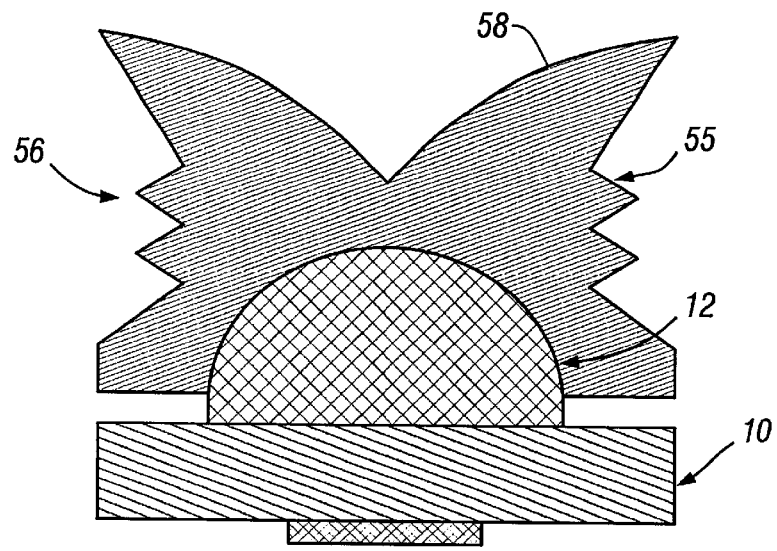
FIG. 5D illustrates a cross-sectional view of a lens cap mating to an LED package.

FIG. 5D illustrates a cross-sectional view of a lens cap 55 mating to a conventional LED package 10 with a hemispherical lens 12. Lens cap 55 may be affixed to lens 12 of LED package 10 by an optical adhesive. Lens cap 55 includes sawtooth, refractive portion 56 and reflective funnel portion 58 that contain the same and/or similar features that operate in the same and/or similar manner, as described above and below, as refractive and TIR portions 56, 58 of lens 44.

Figure 5E:
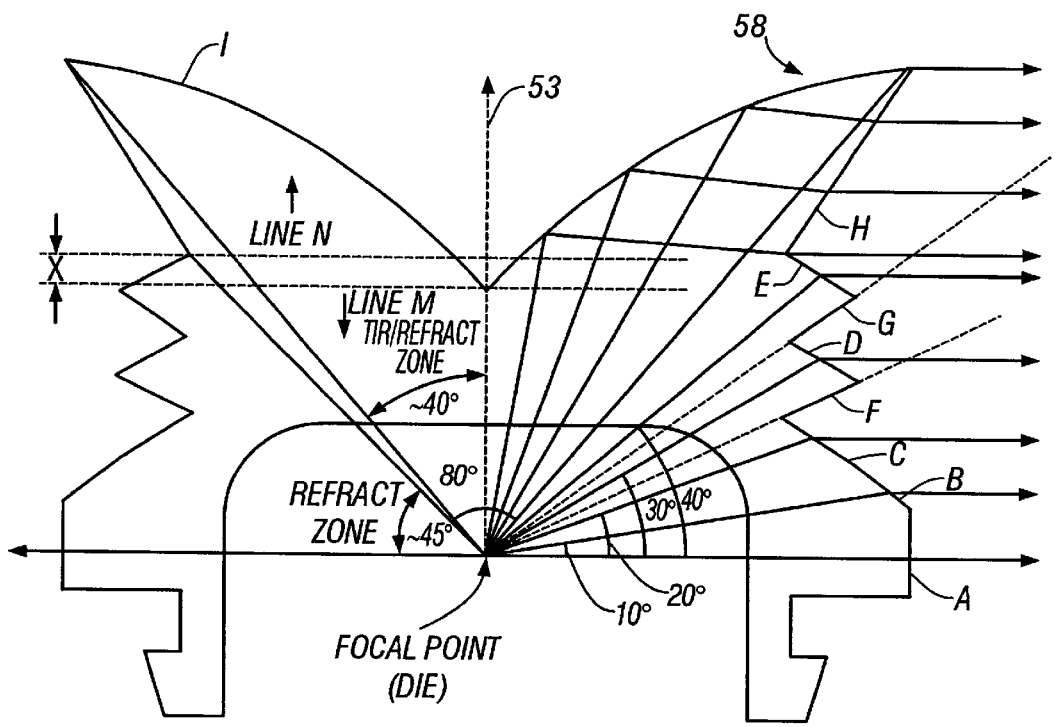
FIG. 5E illustrates ray-traces of one embodiment of a lens.
Figure 5F:
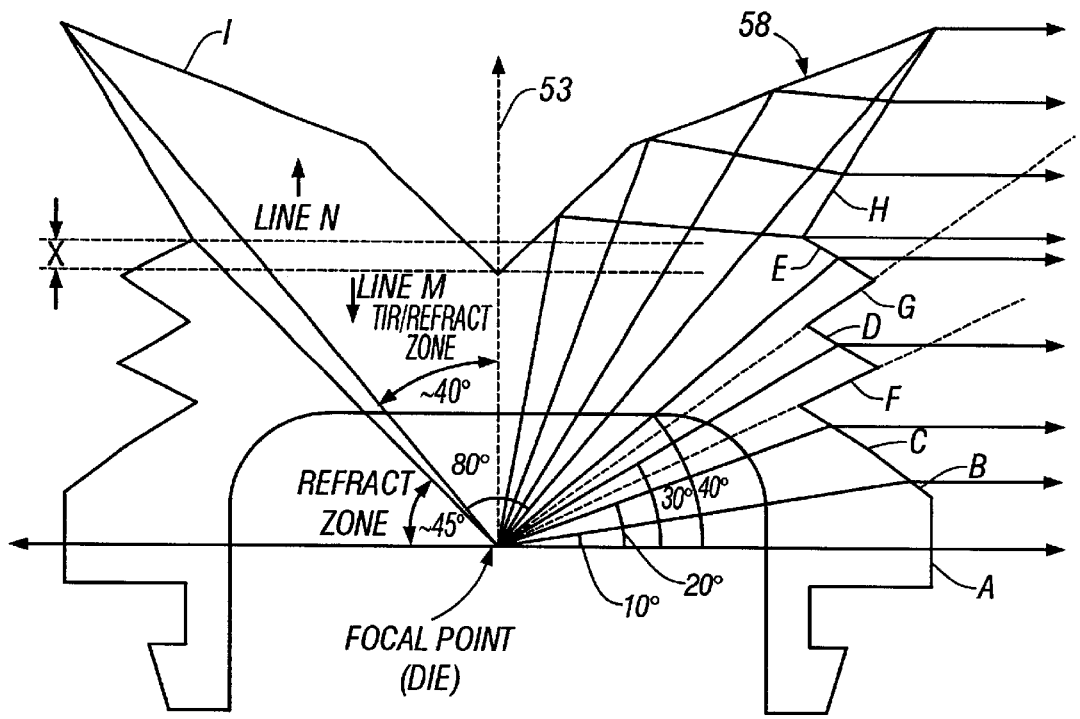
FIG. 5F illustrates ray-traces of another embodiment of a lens.
Figure 5G:
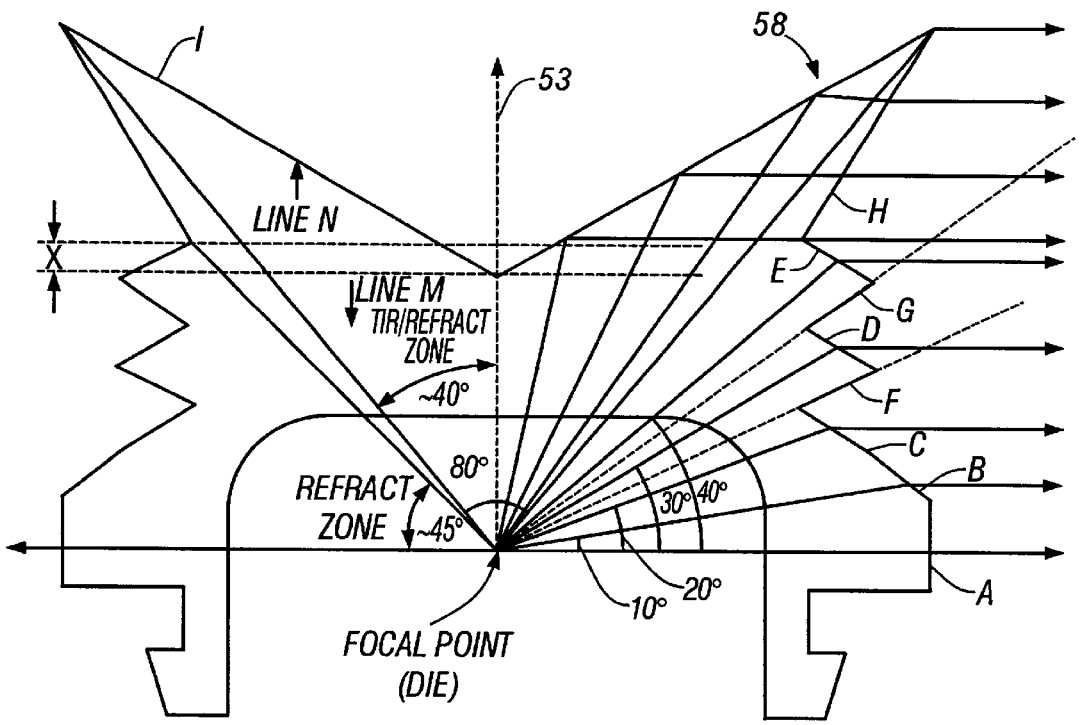
FIG. 5G illustrates ray-traces of a further embodiment of a lens.

FIGS. 5E, 5F and 5G illustrates ray-traces of light through lenses of various curvatures on the top surface of the lens. The features shown in FIGS. 5E–5G are applicable to lenses that are injection molded, cast or otherwise formed. Approximately 33% of the light emitted from LED chip 52 (not shown; light is shown emitted from die focal point F) is reflected off the TIR surface I. FIG. 5E illustrates a curved funnel-shaped portion 58 where Surface I is defined from a curve that maintains an angle greater than the critical angle for TIR but directs the light out of the lens roughly at 90 degrees to longitudinal package axis 53. FIG. 5F illustrates a bent-line funnel-shaped portion 58 where Surface I is defined from a line bent into two linear portions, each portion at an angle greater than the critical angle for TIR but directs the light out of the package roughly at 90 degrees to the package axis. FIG. 5G illustrates a linear funnel-shaped portion 58 where Surface I is defined by a straight line at an angle greater than the critical angle for TIR but directs the light out of the package roughly at 90 degrees to the package axis.

In FIGS. 5E–5G, Surface H works with surface I to emit light perpendicular to longitudinal package axis 53. The angle defined by surface I relative to the die is roughly 80 degrees. Surfaces A, B, C, D & E have surface normals such that the incident light ray is refracted out of the lens at approximately 90 degrees to the longitudinal package axis 53. Surfaces F, G & H are approximately parallel to direct incident light rays in order to minimize the amount of direct light transmitted through these surfaces. Surfaces below line N refract light out of the package. Surfaces above line M will direct light out of the lens through a combination of TIR and refraction. Lines M & N need to be in close proximity of each other to optimize side emission and minimize emission in the longitudinal direction. FIGS. 5E–5G show two zones: zone refraction at approximately 45 degrees or more from longitudinal package axis 53 and zone TIR/refraction at up to approximately 45 degrees from longitudinal package axis 53. For example, in FIGS. 5E–5G, an approximately 40 degree TIR/refraction zone is shown. The interface between the two zones is approximately 45 degrees from the longitudinal package axis 53. A distance X between Line M and Line N is kept at a minimum in order to optimize the side extraction of light from the lens. Line M may equal Line N (i.e., X=0).

Figure 6:
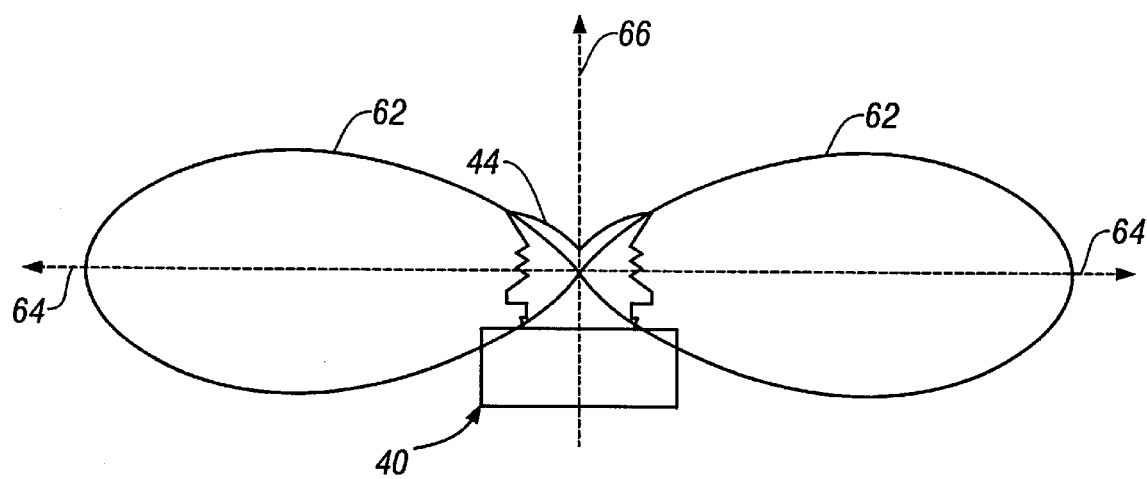
FIG. 6 illustrates side-emission of light from the LED package of FIG. 4.

FIG. 6 illustrates a cross-section of the emission of light from LED package 40 of FIG. 4. Lens 44 of LED package 40 creates a radiation pattern 62 roughly perpendicular to longitudinal package axis 66 of LED package 40. In FIG. 6, this radiation pattern 62 is approximately perpendicular to LED package axis 66 and illustrates relative light intensity and distribution. This field of illumination 62 surrounds LED package 40 and is roughly disk-or toroidal-shaped. Light is emitted from lens 44 approximately parallel to an optical plane 64.

The side-emission of light allows even a single LED package 40 to illuminate multiple light guides 72, as seen in FIG. 7. For example, FIG. 7A. illustrates two planar light guides placed nearly end-to-end with space for at least one LED package 40 between light guides 72. The side-emission of light from the LED package 40 allows light to enter each light guide 72. The LED package 40 may also be inserted into the body of light guide 72. Light guides of various shapes may be used. The sides along the length of the light guides may be planar or taper. For example, a single side emitting LED package 40 may be placed at the center of a disk-shaped light guide (not shown). As light is emitted from the side of LED package 40 in 360 degrees (i.e., in all directions from the center of LED package 40), the light enters the light guide and is refracted and reflected throughout the entire light guide (not shown).

Figure 7A:
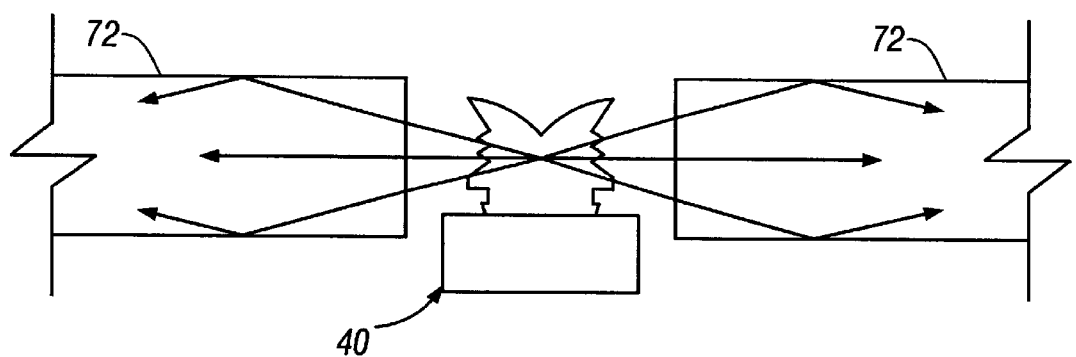
FIG. 7A illustrates a cross-sectional view of the side-emission of light from the LED package of FIG. 4 into two light guides.
Figure 7B:
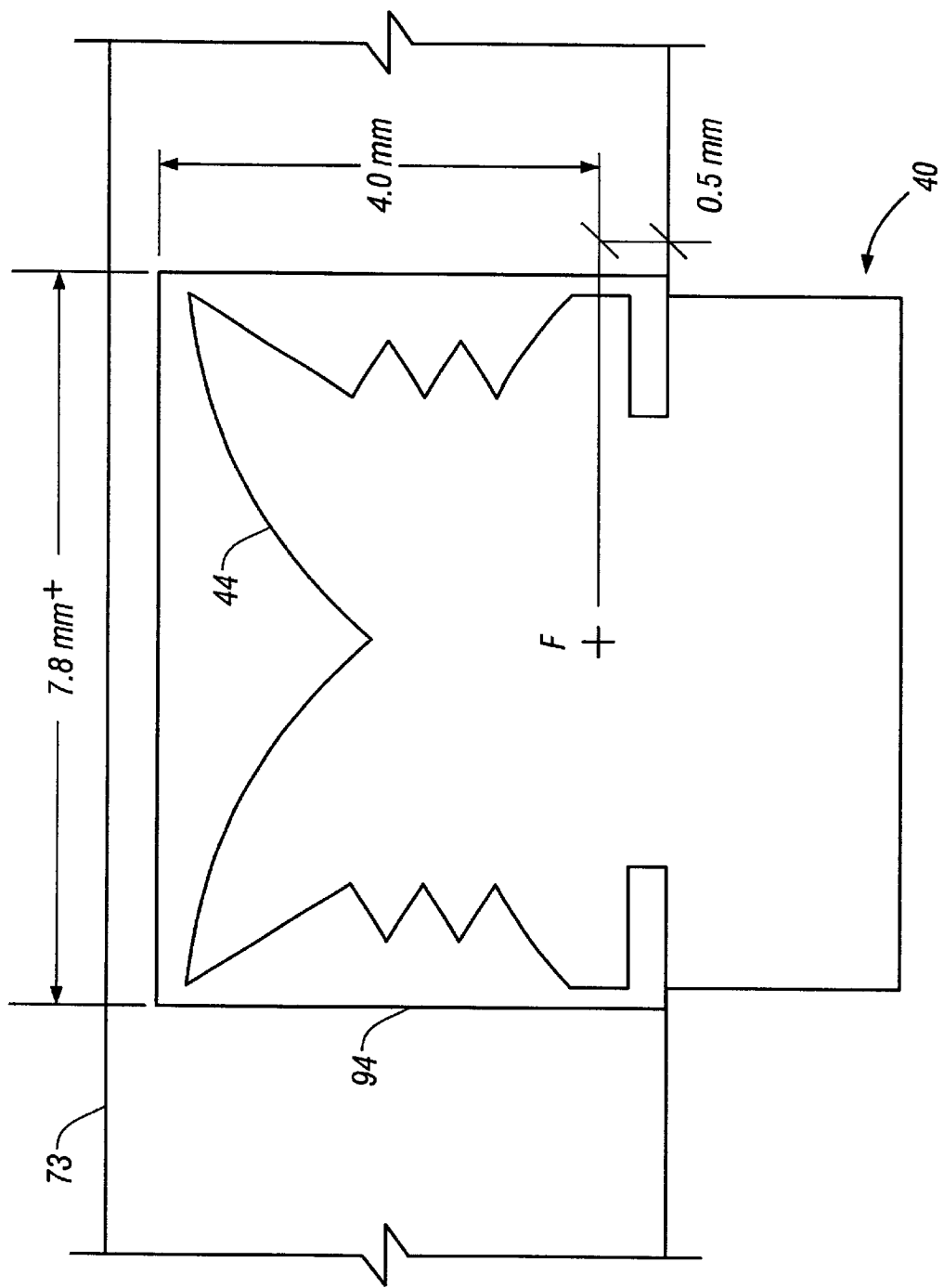
FIG. 7B illustrates a cross-sectional view of the side-emission of light from the LED package of FIG. 4 into a light guide.
Figure 7C:
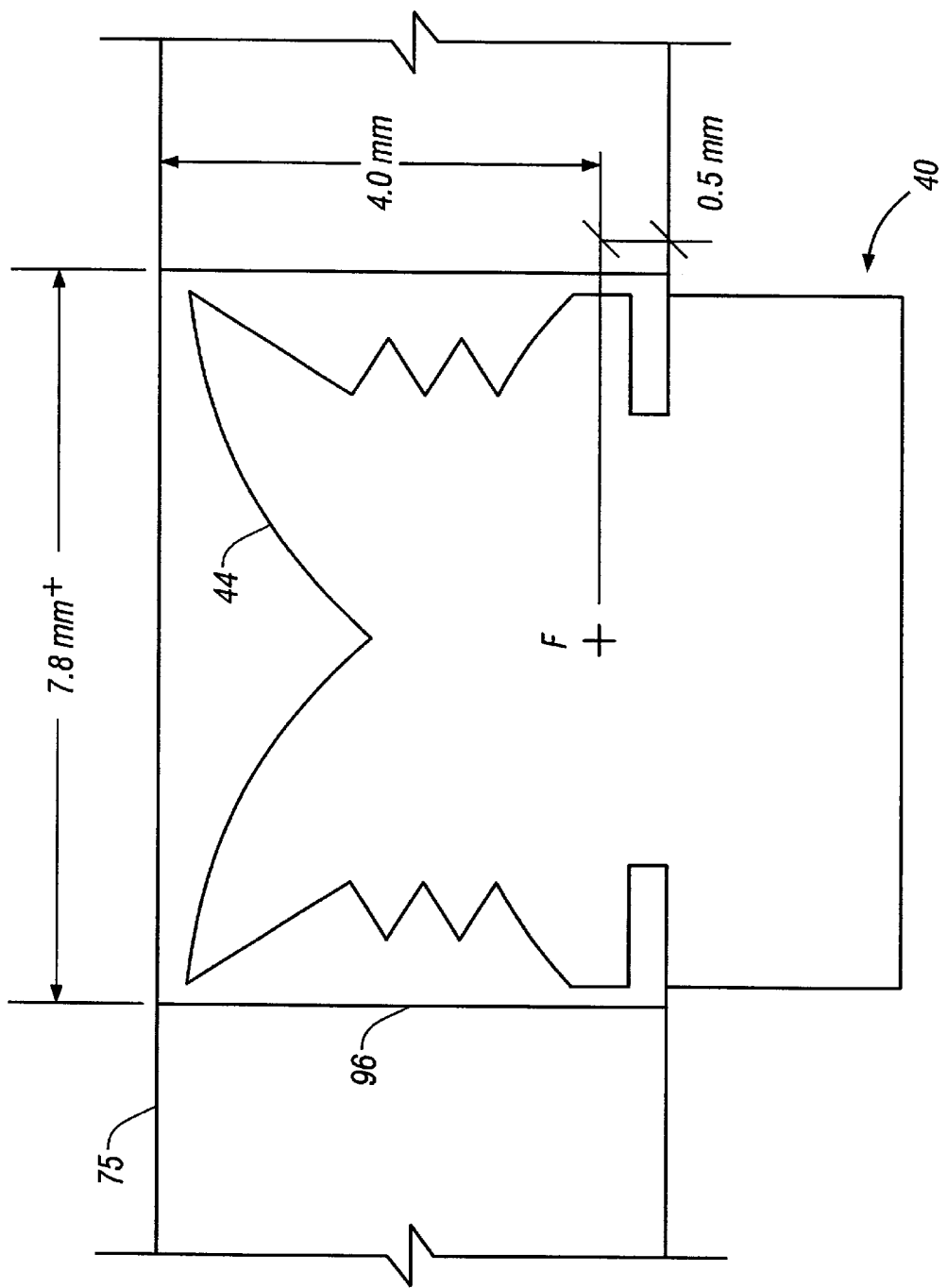
FIG. 7C illustrates a cross-sectional view of the side-emission of light from the LED package of FIG. 4 into a light guide.
Figure 7D:
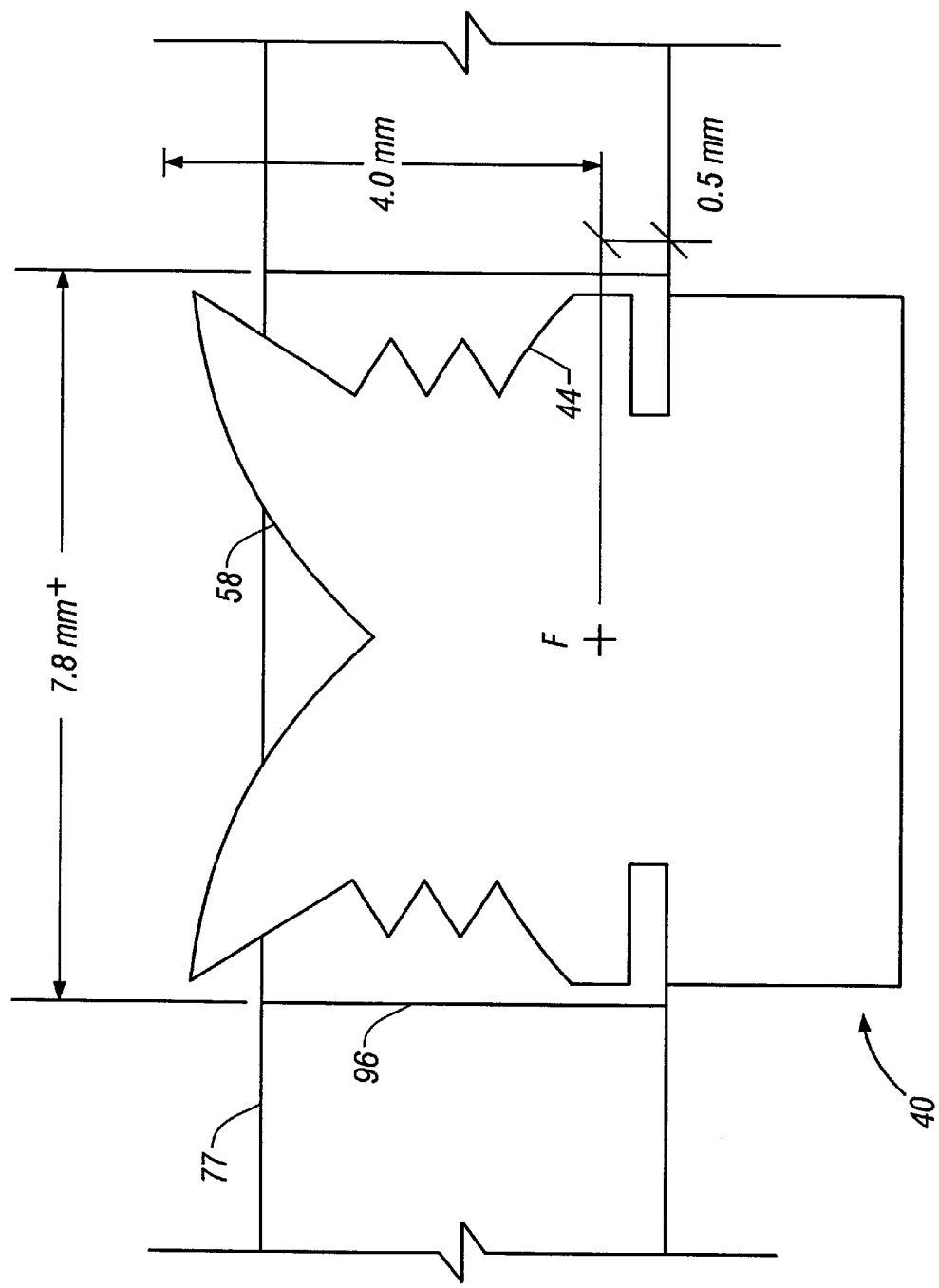
FIG. 7D illustrates a cross-sectional view of the side-emission of light from the LED package of FIG. 4 into a light guide.

The light guide can be made from optically transmissive materials, including but not limited to PC or PMMA. The light guide may be of constant thickness or tapered. Side emission of light allows efficient illumination of thin light guides with a thickness in the optimum range of 2 to 8 mm. FIG. 7B illustrates an example of a light guide 73 with a thickness of 5.0 mm which is greater than the height of lens 44. As the thickness of light guide 73 is greater than the height of the lens 44, a blind-hole 94 may be used in light guide 73 to allow coupling of the LED package 40. The dimensions of lenses 44 of FIGS. 7B, 7C & 7D are measured from the focal point F of lens 44. FIG. 7C illustrates an example of a light guide 75 with a thickness of 4.5 mm and equal to the height of lens 44. As the thickness of light guide 75 is equal to the height of lens 44, a through-hole 96 may be used in light guide 75 to allow coupling of LED package 40. FIG. 7D illustrates side-emission of light from the LED of FIG. 4 into a light guide 77 thinner than the height of lens 44. As the thickness of light guide 77 is less than the height of lens 44, a through-hole 96 must be used in the light guide 77 to allow coupling of LED package 40. Even though light guide 77 is thinner than the height of lens 44, a large portion of the light emitted from LED chip 52 will still be directed into light guide 77 as the bulk of the light emitted from LED chip 52 is emitted from the sides of lens 44. The large portion of the light emitted from lens 44 is targeted toward a light guide 77 that is positioned midway up the height of the lens. For example, the light emitted out the side of lens 44 near the top will be directed slightly downward and the light emitted out the side of lens 44 near the bottom will be directed slightly upward. The portion of light directed into light guide 77 decreases as the thickness of light guide 77 relative to lens 44 decreases. Light guide 77 may be any shape including, without limitation, straight, tapered, rectangular, round or square.

Figure 8:
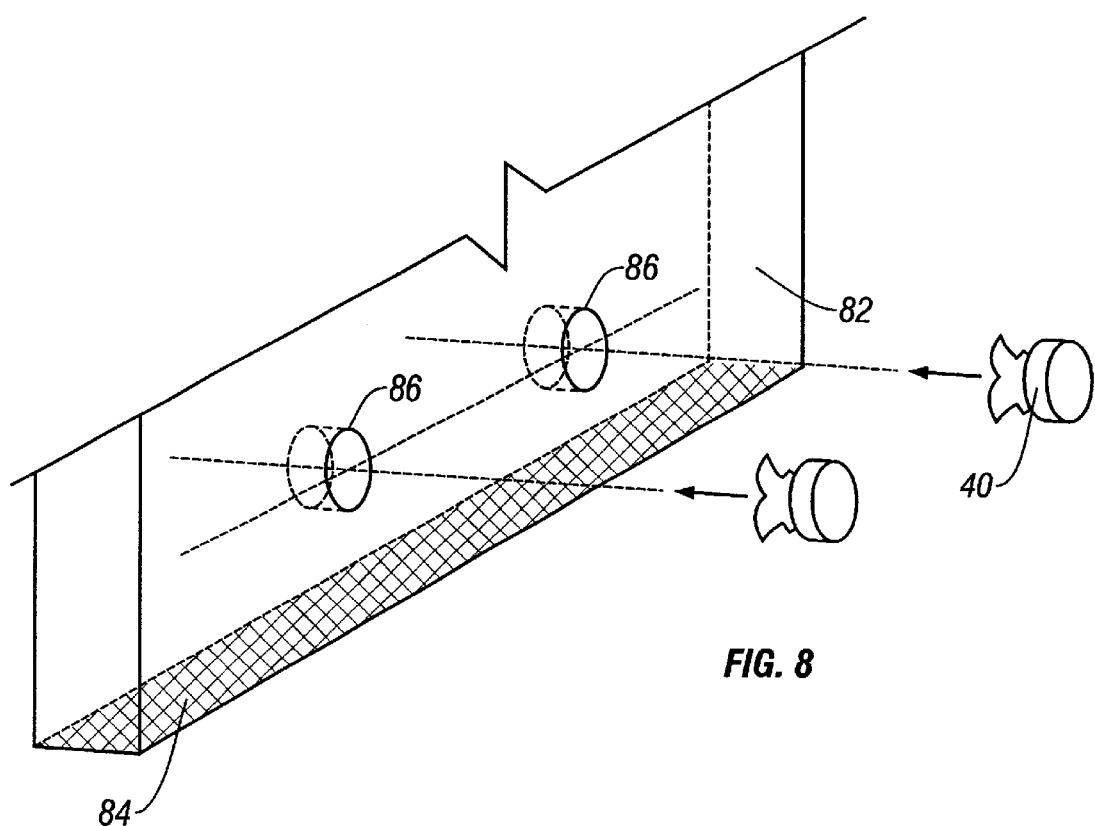
FIG. 8 illustrates a perspective view of a light guide.

FIG. 8 illustrates a perspective view of an end-portion of a planar light guide 82. The side emitting LED package 40 allows LED package 40 to be placed inside light guide 82. One or more holes 86 are made in the body of light guide 82 with a corresponding number of LED assemblies 40 placed within holes 86. Holes 86 may be made to any desired depth in light guide 82, including but not limited to the entire thickness of light guide 82. Lens 44 of LED package 40 may not touch light guide 82. A reflective coating or film 84 may be placed on at least one of the ends of light guide 82 to increase the internal illumination of light guide 82.

Figure 9A:
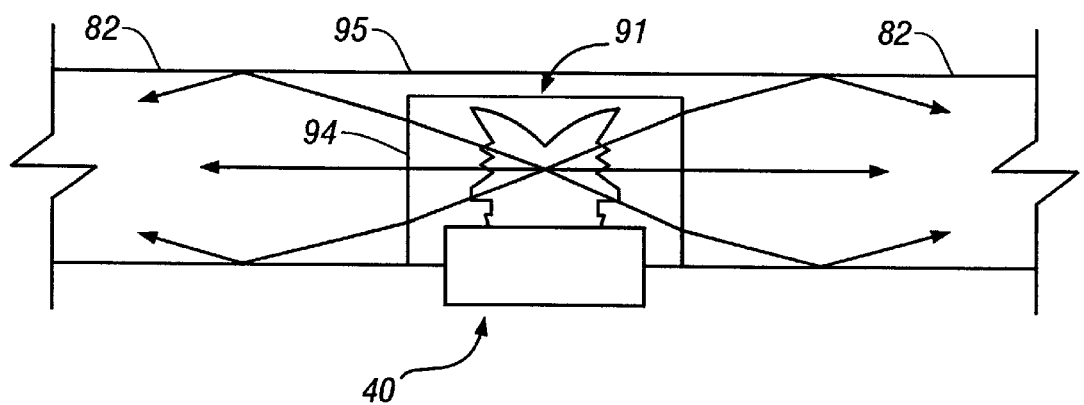
FIG. 9A illustrates a cross-sectional view of the LED package of FIG. 4 mounted in a blind-hole of a light guide.

FIG. 9A illustrates a side-emitting LED package 40 mounted in a blind-hole 94 of a planar light guide 82. Top surface 91 of blind-hole 94 is approximately parallel with top surface 95 of planar light guide 82. Top surface 91 of blind-hole 94 may be coated with a reflective coating or film to reflect light in order to allow for a thinner light guide package with a similar coupling efficiency.

Figure 9B:
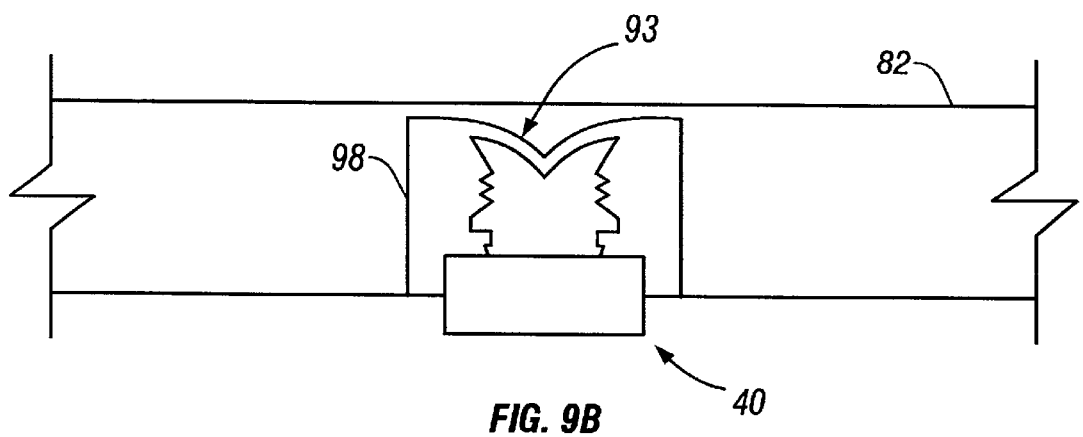
FIG. 9B illustrates a cross-sectional view of the LED package of FIG. 4 mounted in a blind-hole of a light guide.

FIG. 9B illustrates a side-emitting LED package 40 mounted in a funnel-shaped blind-hole 98 of a planar light guide 82. The top surface 93 of funnel-shaped blind-hole 98 is approximately parallel with funnel-shaped portion 58 of lens 44 of LED package 40. Top surface 93 of blind-hole 98 may be coated to reflect light in order to allow for a thinner light guide package with a similar coupling efficiency. The blind hole can have a flat, funnel or curved surface to assist with redirecting light emitted from the LED into the light guide.

Figure 9C:
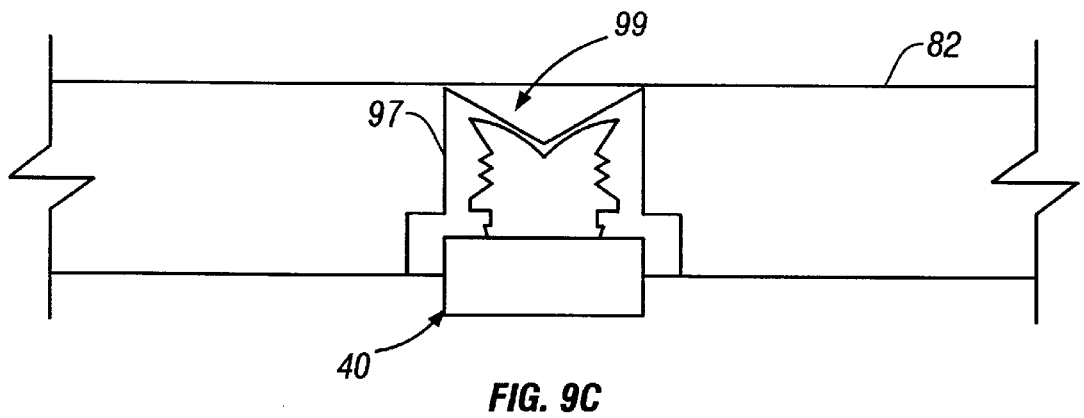
FIG. 9C illustrates a cross-sectional view of the LED package of FIG. 4 mounted in a blind-hole of a light guide.

FIG. 9C illustrates a side-emitting LED package 40 mounted in a v-shaped blind-hole 97 of a planar light guide 82. The v-shaped top surface 99 of the blind-hole 97 is approximately parallel with funnel-shaped portion 58 of lens 44 of LED package 40. The blind hole can have a flat, funnel or curved surface to assist with redirecting light emitted from the LED into the light guide. The top surface 99 of blind-hole 97 may be coated to reflect light in order to allow for a thinner light guide package with a similar coupling efficiency.

Figure 10:
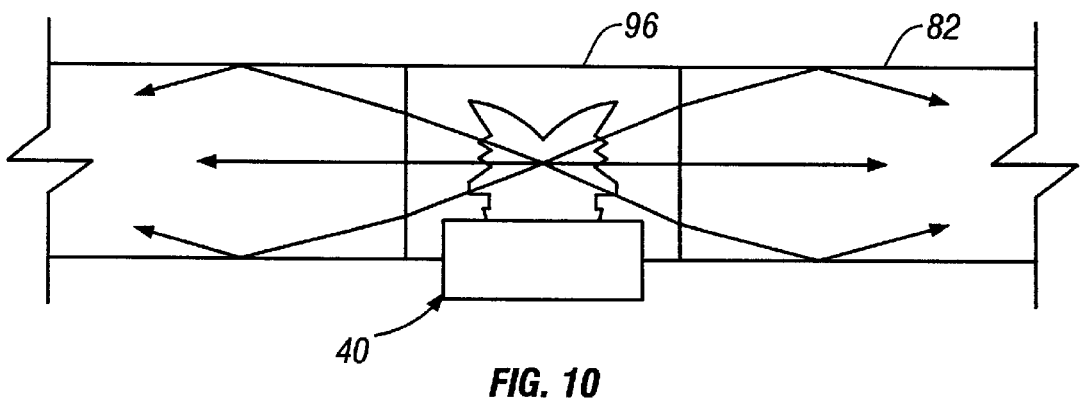
FIG. 10 illustrates a cross-sectional view of the LED package of FIG. 4 mounted in a through-hole of a light guide.

FIG. 10 illustrates a side-emitting LED package 40 mounted in a through-hole 96 of a planar light guide 82. Through-hole 96 allows LED package 40 to be mounted approximately perpendicular with light guide 82.

Figure 11:
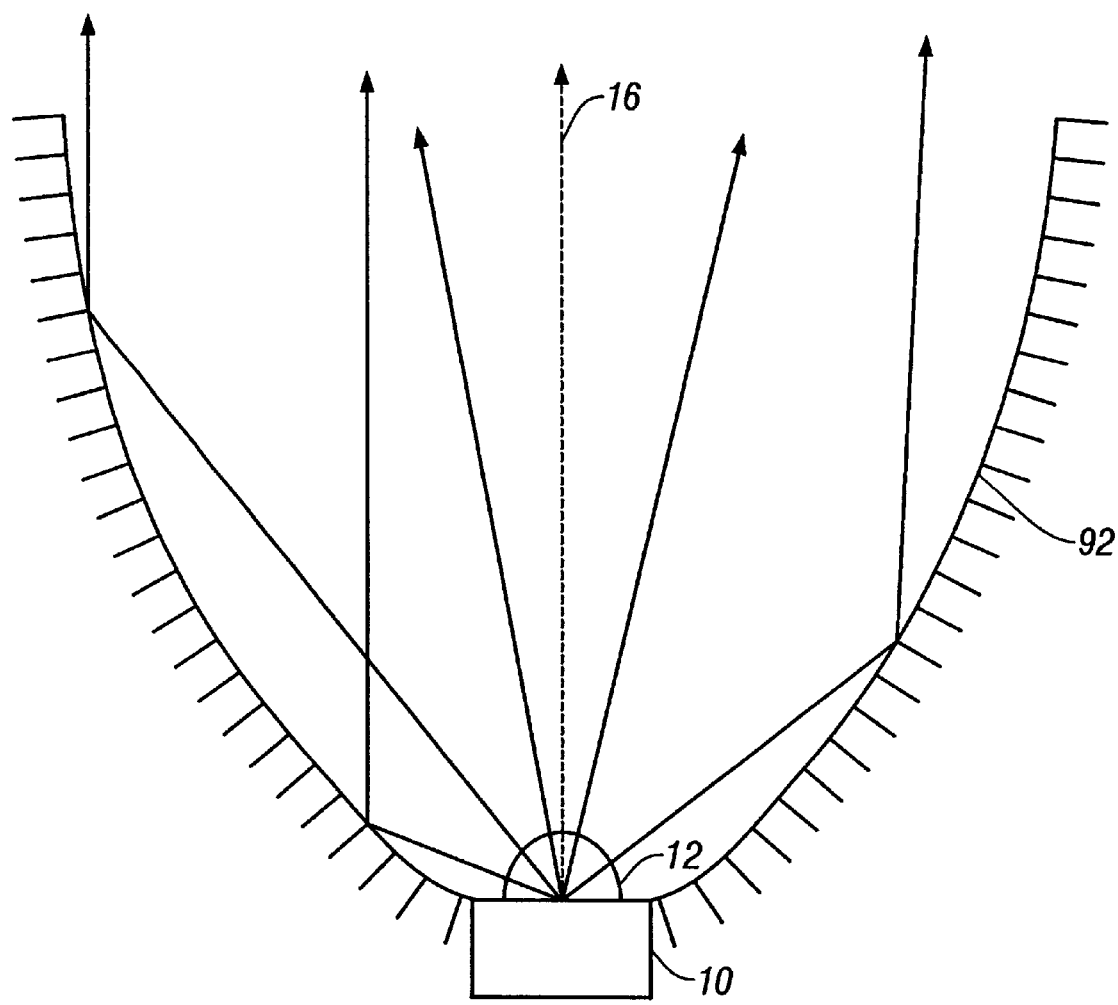
FIG. 11 illustrates a conventional LED package coupled to a reflector.

FIG. 11 illustrates a conventional LED/reflector arrangement. It is known to use an LED package 10 with a hemispherical lens 12 in combination with a deep reflector 92. The deep shape of the cavity of reflector 92 collimates light emitted from the hemispherical lens 12 of LED package 10. This deep reflector cavity is required to control the light.

Figure 12:
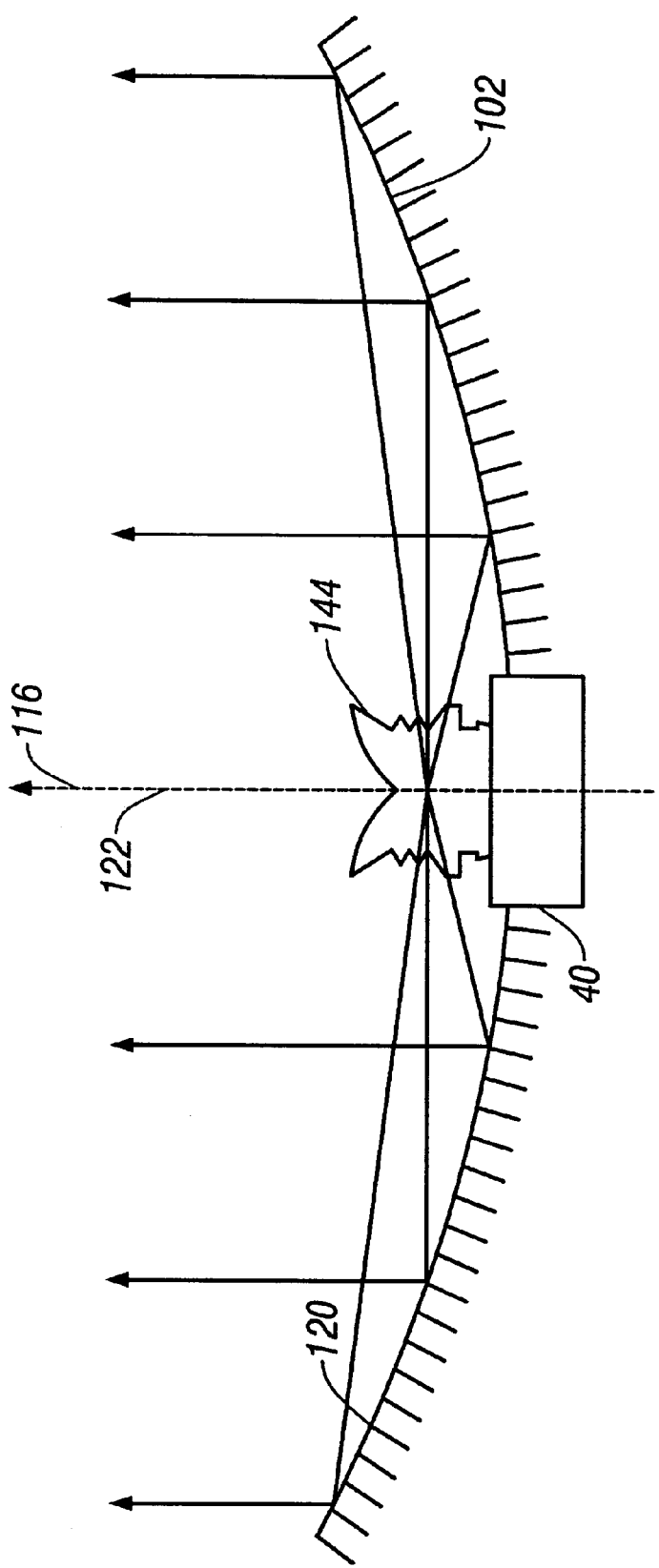
FIG. 12 illustrates the LED package of FIG. 4 in combination with a shallow reflector.

As seen in FIG. 12, a shallow, large-area reflector 102 can be used in combination with a side-emitting LED package 40 to emit light over a broader area than a conventional LED package 10. The longitudinal package axis 116 of the lens is approximately parallel to a radial axis 122 of reflector 102. The side-emission of light allows the walls of reflector 102 to be less deep than conventional reflectors 92 (FIG. 11). Light is emitted from lens 144 roughly perpendicular to longitudinal package axis 116 of LED package 40. Side-emitting LED package 40 allows for very high collection efficiencies with shallow large area reflectors compared to conventional LEDs. Shallow reflectors 102 collimate emitted light over a broader area than narrow, deep reflectors 92 used in combination with conventional LED assemblies 10. Shallow, large-area reflector 102 may be made of BMC bulk molding compound, PC, PMMA, PC/PMMA, and PEI. A reflective film 120 covering the inside of reflector 102 could be metallized, sputtered, or the like with highly reflective materials including, without limitation, aluminum (AL), NiCr, and nickel chrome. Side-emitting LEDs can achieve higher collection efficiencies with deep or shallow reflectors than the conventional LED/deep reflector combination.

The above-described embodiments of the present invention are merely meant to be illustrative and not limiting. It will thus be obvious to those skilled in the art that various changes and modifications may be made without departing from this invention in its broader aspects. Therefore, the appended claims encompass all such changes and modifications as falling within the true spirit and scope of this invention.

We claim:

1. A light-emitting device comprising:
   a light-emitting semiconductor device; and
   a lens comprising:
      a bottom surface;
      a reflecting surface; and
      a refracting surface obliquely angled with respect to a central axis of the lens;
   wherein light emitted by the semiconductor device, entering the lens through the bottom surface, and directly incident on the reflecting surface is reflected from the reflecting surface to the refracting surface and refracted by the refracting surface to exit the lens in a direction substantially perpendicular to the central axis of the lens.

2. The device of claim 1, wherein the lens is diamond turned.

3. The device of claim 1, wherein the lens is injection molded.

4. The device of claim 1, wherein the lens is cast.

5. The device of claim 1, wherein the lens is made of a transparent material.

6. The device of claim 1, wherein the lens is colored.

7. The device of claim 1, wherein the light-emitting semiconductor device is disposed in a package, and wherein the lens is bonded to the package.

8. The device of claim 1, wherein the light-emitting semiconductor device is disposed in a package, and wherein the lens is snap-fit to the package.

9. The light-emitting device of claim 1, wherein the bottom surface of the lens is perpendicular to the central axis of the lens.

10. The device of claim 1, wherein the light-emitting semiconductor device is disposed in a package, and wherein the lens is heat staked to the package.

11. The device of claim 1, wherein the light-emitting semiconductor device is disposed in a package, and wherein the lens is ultra-sonically welded to the package.

12. The device of claim 1, wherein the lens has an index of refraction in the range of approximately 1.45 to 1.6.

13. The device of claim 1, wherein the lens has an index of refraction of approximately 1.53.

14. The device of claim 1, wherein the lens is made of a material selected from the group consisting of PC, PMMA, PEI, Pc/PMMA and COC.

15. The light-emitting device of claim 1, wherein the reflecting surface reflects by total internal reflection.

16. The device of claim 1, wherein the refractive surface further comprises:
   a sawtooth lens portion whereby the sawtooth lens portion refracts light entering the sawtooth lens portion such that a majority of light emitted from the sawtooth lens portion is generally perpendicular to the central axis of the lens.

17. The device of claim 1, wherein the reflective surface further comprises:
   a funnel-shaped lens portion whereby the funnel-shaped lens portion reflects light entering the funnel-shaped lens portion such that a majority of light emitted from the funnel-shaped lens portion is generally perpendicular to the central axis of the lens.

18. The device of claim 17, wherein a surface of said funnel-shaped lens portion curves away from the central axis of the lens.

19. The device of claim 17, wherein a surface of said funnel-shaped lens portion includes at least two linear portions angled with respect to each other and the central axis of the lens.

20. The device of claim 17, wherein a surface of said funnel-shaped lens portion is a straight line at an angle with respect to the central axis of the lens.

21. The device of claim 1, wherein the refractive surface further comprises a sawtooth lens portion; and the reflective surface further comprises a funnel-shaped lens portion whereby the sawtooth and funnel-shaped lens each direct light entering the sawtooth and funnel-shaped lens portions such that a majority of light emitted from each of the sawtooth and funnel-shaped lens portions is generally perpendicular to the central axis of the lens.

22. The device of claim 1, wherein there is a sealed space between the light-emitting semiconductor device and the lens.

23. The device of claim 1, wherein there is a sealed space filled with a resin between the light-emitting semiconductor device and the lens.

24. The device of claim 23, wherein the resin is optically transparent.

25. The device of claim 23, wherein the resin is silicone.

26. The device of claim 1, further comprising a sealed space between the light-emitting semiconductor device and the lens wherein the sealed space is filled with an epoxy.

27. The device of claim 1, wherein there is a sealed space filled with an optically transparent material between the light-emitting semiconductor device and the lens.

28. The device of claim 1, wherein there is a sealed space filled with a material with an index of refraction ranging approximately between 1.4 to 1.6 located between the light-emitting semiconductor device and the lens.

29. The device of claim 1, further comprising:
a light guide whereby light emitted from the lens enters the light guide.

30. The device of claim 29, wherein the lens is mounted along the perimeter of the light guide.

31. The device of claim 29, wherein the lens is mounted within at least one hole in the light guide.

32. The device of claim 31, wherein said hole further comprises an inner surface roughly parallel to a first surface of the lens.

33. The device of claim 32, wherein the inner surface is linear.

34. The device of claim 32, wherein the inner surface is funnel-shaped.

35. The device of claim 32, wherein the inner surface is V-shaped.

36. The device of claim 29, wherein the light guide is made a material selected from the group consisting of PC and PMMA.

37. The device of claim 29, wherein the light guide ranges in thickness from approximately 2 to 8 mm.

38. The device of claim 29, wherein the light guide has a thickness greater than a length of the lens.

39. The device of claim 29, wherein the light guide has a thickness less than a length of the lens.

40. The device of claim 29, wherein the light guide has a thickness at least equal to a length of the lens.

41. The device of claim 31, wherein the hole in the light guide has a depth approximately equal to a length of the lens.

42. The device of claim 31, wherein the hole in the light guide has a depth less than a length of the lens.

43. The device of claim 31, wherein the hole in the light guide has a depth greater than a length of the lens.

44. The device of claim 29, wherein the light-emitting semiconductor device is located at a center of the light guide.

45. The device of claim 29, wherein a surface finish is applied to the light guide whereby the surface finish reflects light.

46. The device of claim 29, wherein a surface coating is applied to the light guide whereby the surface coating reflects light.

47. The device of claim 1, further comprising:
a reflector mounted to the light-emitting semiconductor device whereby the light emitted from the lens is redirected by the reflector to an intended target.

48. The device of claim 47, wherein the intended target is substantially perpendicular to the central axis of the lens.

49. The device of claim 47, wherein the light-emitting semiconductor device is mounted within at least one hole in the reflector.

50. The device of claim 47, wherein a height of the reflector is less than or equal to a length of the lens.

51. The device of claim 47, wherein a height of the reflector is greater than or equal to a length of the lens.

52. The device of claim 47, wherein a height of the reflector is approximately equal to a length of the lens.

53. The device of claim 47, wherein a surface coating is applied to the reflector.

54. The light-emitting device of claim 1, wherein the reflecting surface is a surface of a funnel-shaped portion of the lens.

55. The light-emitting device of claim 1, wherein the lens further comprises a second refracting surface and light emitted by the semiconductor device, entering the lens through the bottom surface, and directly incident on the second refracting surface is refracted by the second refracting surface to exit the lens in a direction substantially perpendicular to the central axis.

56. The light-emitting device of claim 1, wherein the second refractive surface is a surface of a saw tooth portion of the lens.

57. The light-emitting device of claim 1, wherein the reflecting and refracting surfaces of the lens are each portions of surfaces having cylindrical symmetry about the central axis.

58. The device of claim 1, further comprising a sealed space between the light-emitting semiconductor device and the lens wherein the sealed space is filled with a transparent material.

59. The device of claim 58, wherein the transparent material is colored.

60. The device of claim 1, wherein there is substantially no light emitted from the lens along the central axis of the lens.

61. A method of emitting light from a light emitting diode, comprising:
generating a light output from a light emitting diode package, said package containing a light emitting diode for emitting light; and
redirecting light from the light emitting diode using a lens comprising a bottom surface, a reflecting surface, and a refracting surface obliquely angled with respect to a central axis of the lens, wherein redirecting light from the light emitting diode comprises:
receiving light through the bottom surface;
refracting light incident on the refracting surface such that the refracted light exits the lens in a direction substantially perpendicular to the central axis of the lens; and
reflecting light incident on the reflecting surface such that the reflected light exits the lens in a direction substantially perpendicular to the central axis of the lens.

62. The method of claim 61, wherein:
the refracting surface comprises a sawtooth portion of the lens whereby the sawtooth portion refracts light such that a majority of light emitted from the sawtooth portion is substantially perpendicular to the central axis of the lens.

63. The method of claim 61, wherein:
the reflecting surface comprises a funnel-shaped portion of the lens whereby the funnel-shaped portion reflects light such that a majority of light emitted from the funnel-shaped portion is substantially perpendicular to the central axis of the lens.

* * * * *

UNITED STATES PATENT AND TRADEMARK OFFICE
CERTIFICATE OF CORRECTION

PATENT NO. : 6,598,998 B2
DATED : July 29, 2003
INVENTOR(S) : Robert S. West, Gary D. Sasser and James W. Stewart It is certified that error appears in the above-identified patent and that said Letters Patent is hereby corrected as shown below:

Column 8,
Line 3, cancel "tens" and substitute -- lens --.
Line 16, cancel "Pc/" and substitute -- PC/ --.

Signed and Sealed this

Thirtieth Day of December, 2003

JAMES E. ROGAN
*Director of the United States Patent and Trademark Office*